United States Patent [19]
Shoemaker

[11] Patent Number: 5,617,352
[45] Date of Patent: Apr. 1, 1997

[54] NON-VOLATILE, BIDIRECTIONAL, ELECTRICALLY PROGRAMMABLE INTEGRATED MEMORY ELEMENT IMPLEMENTED USING DOUBLE POLYSILICON

[75] Inventor: Patrick A. Shoemaker, Lemon Grove, Calif.

[73] Assignee: The United States of America as represented by the Secretary of the Navy, Washington, D.C.

[21] Appl. No.: 572,205

[22] Filed: Dec. 13, 1995

[51] Int. Cl.$^6$ ..................... G11C 11/34
[52] U.S. Cl. ............... 365/185.08; 365/185.1; 257/315
[58] Field of Search .............. 365/185.03, 185.08, 365/185.1; 257/316, 315, 317, 318, 319, 320

[56] References Cited

U.S. PATENT DOCUMENTS

| | | |
|---|---|---|
| 4,845,680 | 7/1989 | Iwahashi ............... 365/185.08 |
| 4,930,105 | 5/1990 | Matsumoto et al. . |
| 4,980,859 | 12/1990 | Guterman ............... 365/185.08 |
| 5,016,217 | 5/1991 | Brahmbhatt ............. 365/185.08 |
| 5,020,030 | 5/1991 | Huber . |
| 5,027,171 | 6/1991 | Reedy et al. . |
| 5,107,461 | 4/1992 | Riva . |
| 5,136,540 | 8/1992 | Hayashi ............... 365/185.08 |
| 5,166,562 | 11/1992 | Allen et al. . |
| 5,253,196 | 10/1993 | Shimabukuro et al. . |
| 5,481,492 | 1/1996 | Shoemaker . |

*Primary Examiner*—David C. Nelms
*Assistant Examiner*—Son Mai
*Attorney, Agent, or Firm*—Harvey FEndelman; Peter A. Lipovsky; Michael A. Kagan

[57] ABSTRACT

A non-volatile, bidirectional electrically programmable integrated memory element is describe which includes a dielectric structure supported by a substrate and a programming terminal supported by the dielectric structure. The programming terminal includes: (1) a first polysilicon structure; a second polysilicon structure; and an electrically conductive first interconnect which electrically connects the first polysilicon structure to the second polysilicon structure; (2) a floating gate structure supported by the dielectric structure which includes: (a) a third polysilicon structure which overlies and is separated from a section of the first polysilicon structure by the dielectric structure; (b) a fourth polysilicon structure which is overlain and separated from a section of the second polysilicon structure by the dielectric structure; and (c) an electrically conductive second interconnect which electrically couples the third polysilicon structure to the fourth polysilicon structure. The memory element also includes a capacitor electrically connected to the second interconnect.

14 Claims, 9 Drawing Sheets

NON-VOLATILE, BIDIRECTIONAL, ELECTRICALLY PROGRAMMABLE INTEGRATED MEMORY ELEMENT IMPLEMENTED USING DOUBLE POLYSILICON

The present invention relates to integrated circuits, and more particularly, to a non-volatile bidirectional, electrically programmable integrated memory element in which a floating gate may be symmetrically charged and discharged electrically.

BACKGROUND OF THE INVENTION

A non-volatile analog memory element in which the stored quantity can be both incremented and decremented is an essential component in a number of novel computer architectures. Associative memories, neural networks and general purpose analog computers may employ analog memory elements.

U.S. Pat. No. 5,027,171, entitled "Dual Polarity Floating Gate MOS Analog Memory Device," describes a nonvolatile memory cell comprising two pairs of complementary metal oxide field effect transistors. Each pair includes a p-channel and an n-channel transistor. The gates of each transistor are electrically connected together to form a common floating gate. The sources of the transistors of the first transistor pair are connected to a common ground. The sources of the second pair of transistors are operably electrically connected together to form an output junction. Sufficiently large positive voltage applied to the drain of the n-channel transistor of the first transistor pair causes a positive charge to be stored in memory, or increases a charge previously stored in memory. Sufficiently large negative voltage applied to the drain of the p-channel transistor of the first transistor pair causes a negative charge to be stored in memory when there previously was no charge stored in memory, or decreases a charge previously stored in memory. The limitations of this device include highly asymmetric charge/discharge, i.e., positive charge (holes) may be injected onto the floating gate at a much slower rate than negative charge (electrons). A problem with such asymmetric charging characteristics is that the device requires extremely long programming times for charging in one direction compared to the time required to charging in the other direction.

U.S. Pat. No. 5,166,562, entitled "Writable Analog Reference Voltage Device," describes a bipolar analog memory in which interpoly tunneling is used for changing the charge on a floating gate in one direction. Hot electron injection from the substrate is used to charge the gate with electrons, resulting in asymmetric write/erase characteristics.

U.S. Pat. No. 5,253,196, entitled "MOS Analog Memory With Injection Capacitors," describes a non-volatile memory element for storing analog information. The value stored in memory can be increased or decreased electrically. Analog memory information is stored as an electrical charge on a floating gate structure. Modification of the stored charge is accomplished by hot carrier injection to transport electrons both onto and off the floating gate. Charge is written onto and off of the floating gate by injection capacitors in deep depletion. Such charge transfer is accomplished by having the floating gate contiguous with a piece of crystalline p-type silicon in which a deep depletion region may be formed. Hot electrons may be ejected from the floating gate structure through surrounding insulating oxide. The floating gate structure is capacitively coupled to a second piece of crystalline silicon from which electrons may be injected onto the floating gate structure. However, this device is manufactured using silicon-on-insulator processes which tends to be relatively expensive and are not as commonly practiced as are bulk silicon processes.

U.S. Pat. No. 5,166,562, entitled "Writable Analog Reference Voltage Storage Device," describes a circuit for generating an N number of analog voltages using an N number of analog floating gate storage devices. Electron injection circuitry is provided for injecting electrons on to and removing electrons from the floating gate of each floating gate storage device. A follower amplifier is connected to each floating gate storage device and drives an analog output voltage bus. A capacitor is connected to each analog output storage bus. An analog pass gate is connected between each analog output voltage bus and a common monitor/dynamic load bus. Each analog pass gate is driven by a strobe signal. The hot electron injection from the substrate to charge the gates with electrons results in asymmetric write/erase characteristics.

Therefore, a need exists for a bidirectional, non-volatile memory device having symmetric charge characteristics, and which may be manufactured using relatively inexpensive and common bulk silicon processes.

SUMMARY OF THE INVENTION

A non-volatile bidirectional, electrically programmable integrated memory element is describe which includes a dielectric structure supported by a substrate and a programming terminal supported by the dielectric structure. The programming terminal has a first polysilicon structure; a second polysilicon structure; and an electrically conductive first interconnect which electrically connects the first polysilicon structure to the second polysilicon structure. The memory element also includes a floating gate structure supported by the dielectric structure which has (a) a third polysilicon structure which overlies and is separated from a section of the first polysilicon structure by the dielectric structure; (b) a fourth polysilicon structure which is overlain and separated from a section of the second polysilicon structure by the dielectric structure; and (c) an electrically conductive second interconnect which electrically couples the third polysilicon structure to the fourth polysilicon structure. The memory element further includes a capacitor electrically connected to the second interconnect.

An important advantage of the present invention is that it provides a bidirectional, non-volatile memory device having symmetric charge characteristics.

Another advantage of the invention is that it may be manufactured using relatively inexpensive and common bulk silicon.

These and other advantages of the invention will become more readily apparent upon review of the following specification, including the claims, and the accompanying figures.

BRIEF DESCRIPTION OF THE FIGURES

Throughout the several views, like elements are referenced with like reference numerals.

DESCRIPTION OF THE PREFERRED EMBODIMENT

The present invention provides a non-volatile bidirectional integrated memory element in which an electric charge may be selectively incremented and decremented (i.e., "programmed" and "erased"). The memory element may be manufactured using relatively low-cost and reliable double-polysilicon MOS processes.

Figure 1:
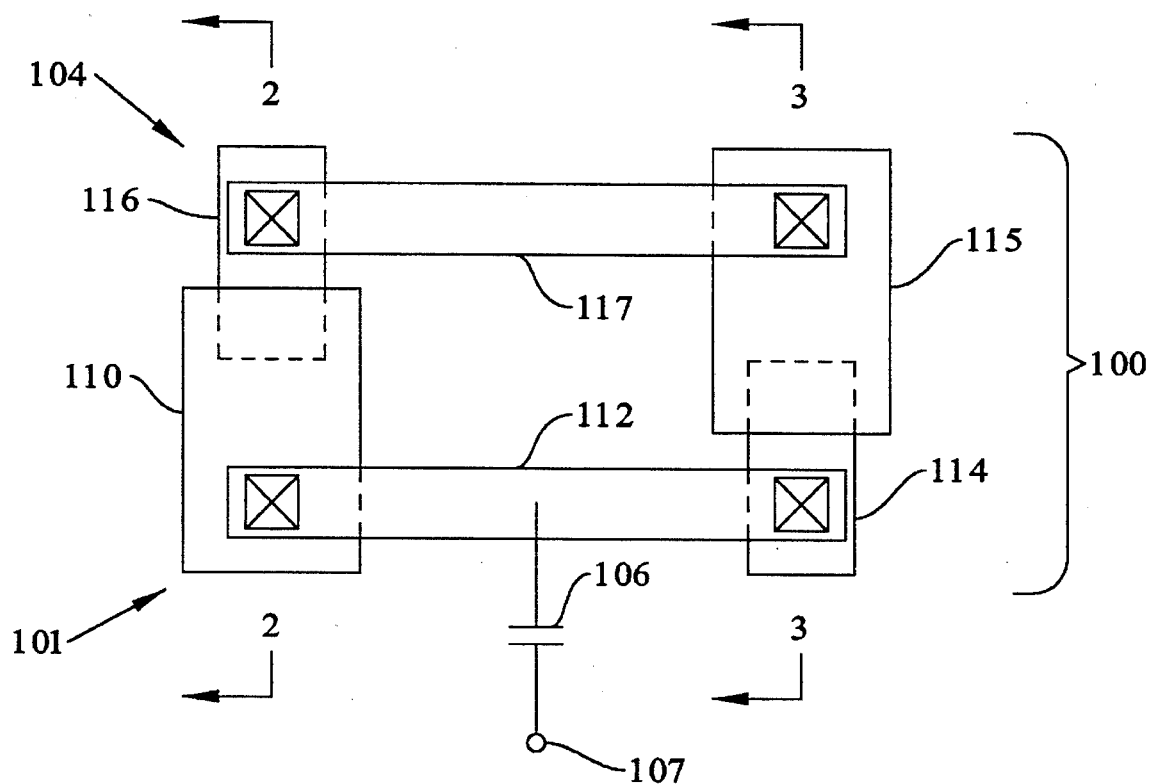
FIG. 1 shows a plan view of a non-volatile bidirectional, electrically programmable integrated memory element embodying various features of the present invention.
Figure 2:
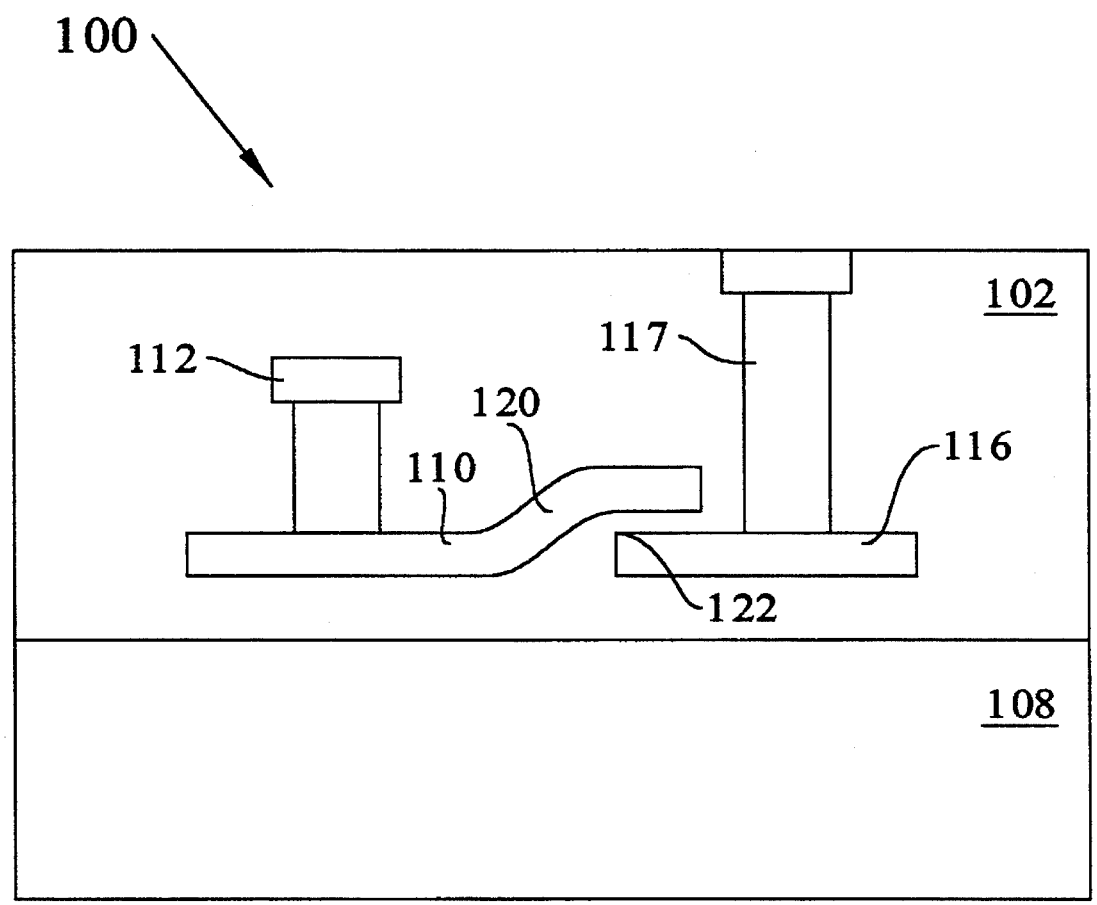
FIG. 2 is a cross-sectional view of the integrated memory element of FIG. 1 taken along view 2—2.
Figure 3:
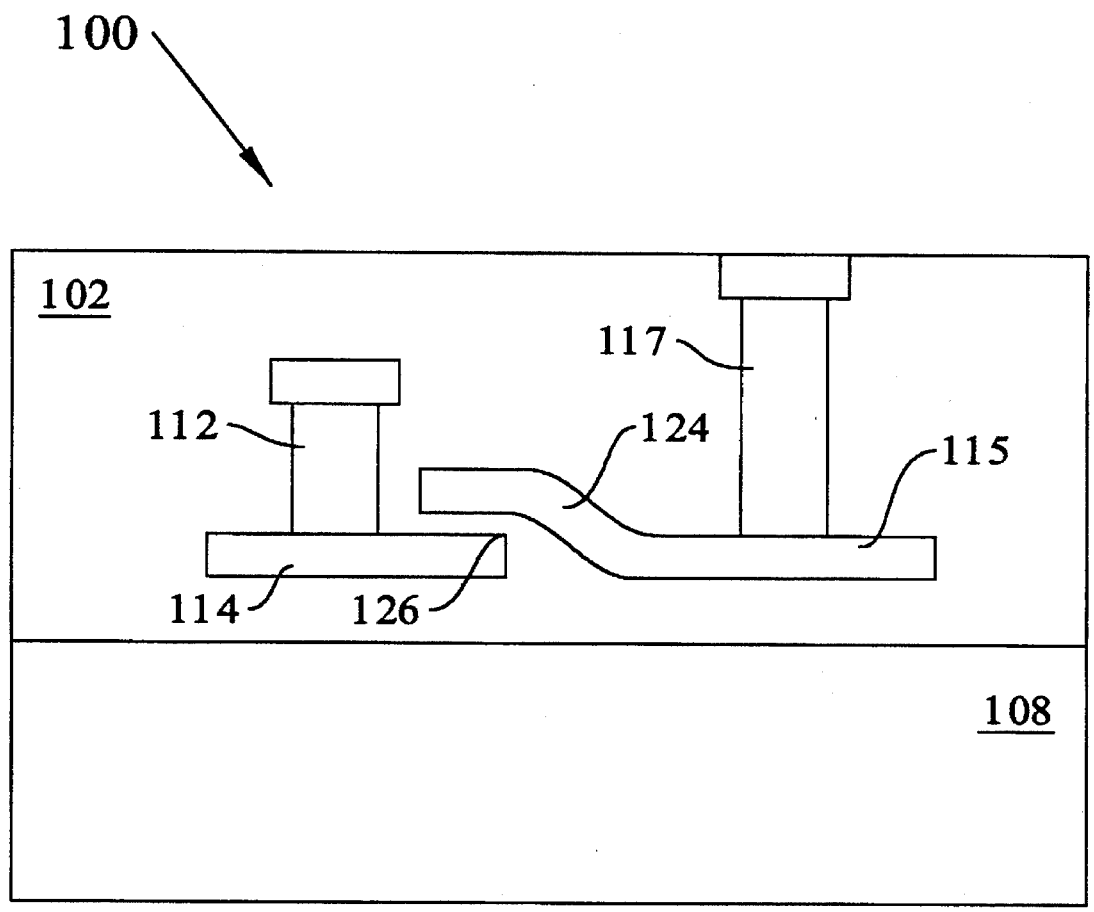
FIG. 3 is a cross-sectional view of the integrated memory element of FIG. 1 taken along view 3—3.

Referring to FIGS. 1–3, collectively, there is shown a non-volatile bidirectional, electrically programmable integrated memory element 100 comprising a floating gate structure 101 supported in and electrically isolated from the external world by a dielectric structure 102, a programming terminal 104 supported by the dielectric structure 102 for transferring electric charge from an external voltage source (not shown) to and from the floating gate structure 101, and a capacitor 106 for biasing the floating gate structure 101. The dielectric structure 102 comprises one or more layers (not shown) of an electrically insulating material such as an oxide or nitride formed over a substrate 108 such as bulk semiconductor. Particular implementations of the capacitor 106 are described further herein and illustrated in the figures. Charge on the floating gate structure 101 is incremented by applying a positive voltage having a predetermined magnitude to the programming terminal 104 relative to the bias terminal 107. Charge on the floating gate structure 101 is decremented by applying a negative voltage having a predetermined magnitude to the programming terminal 104 relative to the bias terminal 107, shown in FIG. 1. Typically, magnitudes of the positive and negative voltages such as described above may be in the range of 18–30 volts.

The floating gate structure 101 includes a polysilicon structure 110, supported by the dielectric structure 102, that is electrically connected by an electrically conductive interconnect 112 to a polysilicon structure 114. The dielectric structure 102 also supports the polysilicon structure 114. The programming terminal 104 includes a polysilicon structure 115 connected by an electrically conductive interconnect 117 to a polysilicon structure 116, also supported by the dielectric structure 102.

As shown in FIG. 2, an S-shaped cross-section 120 of the polysilicon structure 110 overlies and is electrically isolated from an edge 122 of the polysilicon structure 116 by the intervening dielectric structure 102. A suitable distance between the S-shaped cross-section 120 of the polysilicon structure 110 and the corner 122 of the polysilicon structure 116 is not precisely known. However, such distance results from the deposition processes by which the dielectric structure 102 layer is formed over the edge 122 of the polysilicon structure 116. It is known, however, that at edges and corners, as for example, edge 122, there is pronounced thinning of the dielectric structure 102 relative to its thickness over flat areas of the polysilicon structure 116. The thinning of the dielectric structure 102 over the edge 122 of polysilicon structure 115 is thought to allow charge transfer, probably by tunneling, through the dielectric structure 102 between the polysilicon structures 110 and 116.

Referring to FIG. 3, an S-shaped cross-section 124 of the polysilicon structure 115 overlies and is electrically isolated from a corner 126 of the polysilicon structure 114 by the intervening dielectric structure 102. As described with regard to the structures illustrated in FIG. 2, an appropriate distance between the S-shaped cross-section 124 of the polysilicon structure 115 and the corner 126 of the polysilicon structure 114 results from the fabrication of the intervening dielectric structure 102 between the polysilicon structures 114 and 115. The fabrication of polysilicon structures 110, 114, 115, and 116 may be accomplished using well known double-layer polysilicon processing. [See for example, FIG. 1d of U.S. Pat. No. 5,166,562.]

Figure 4:
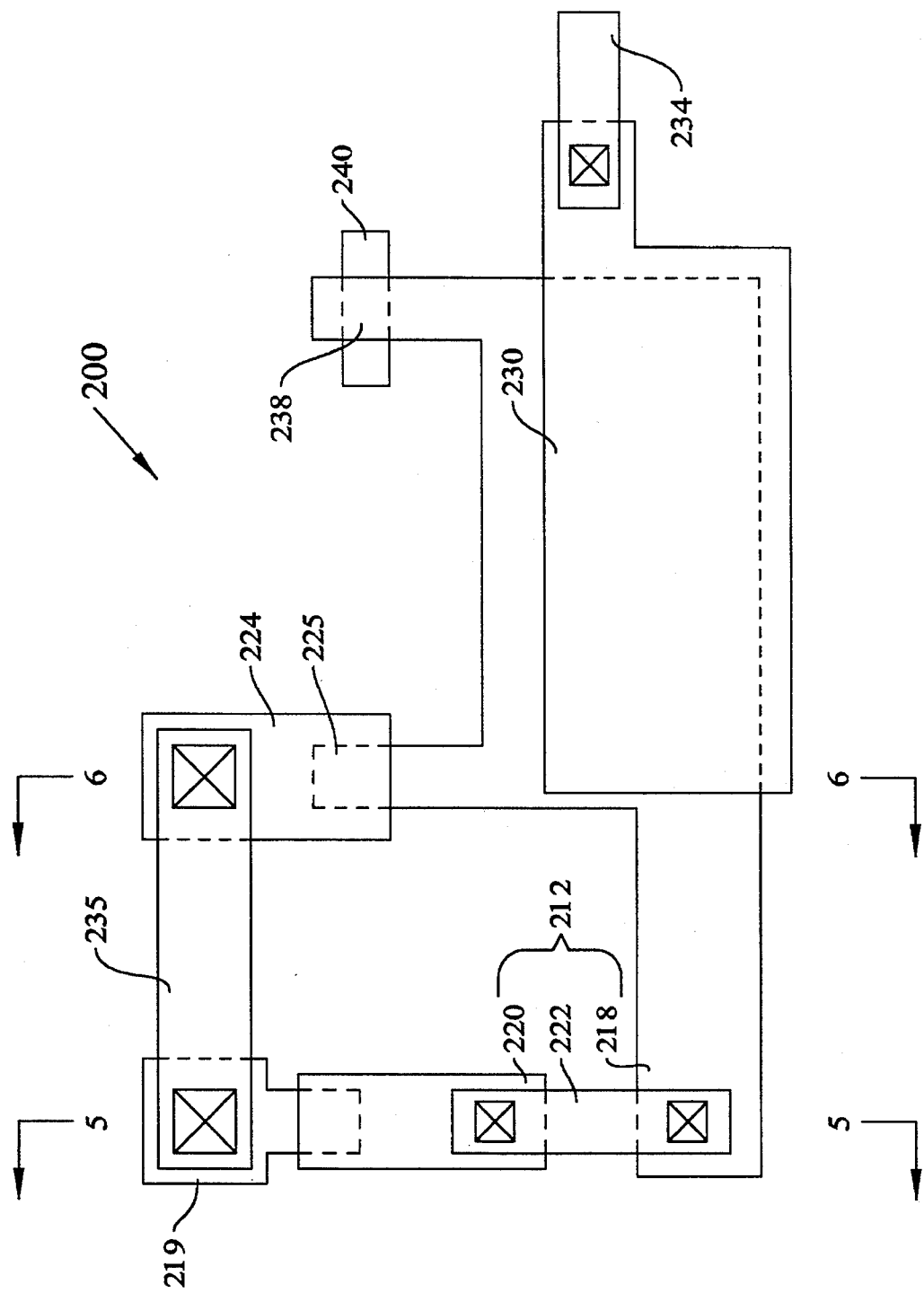
FIG. 4 shows a plan view of another embodiment of a non-volatile bidirectional integrated memory element embodying various features of the present invention.
Figure 5:
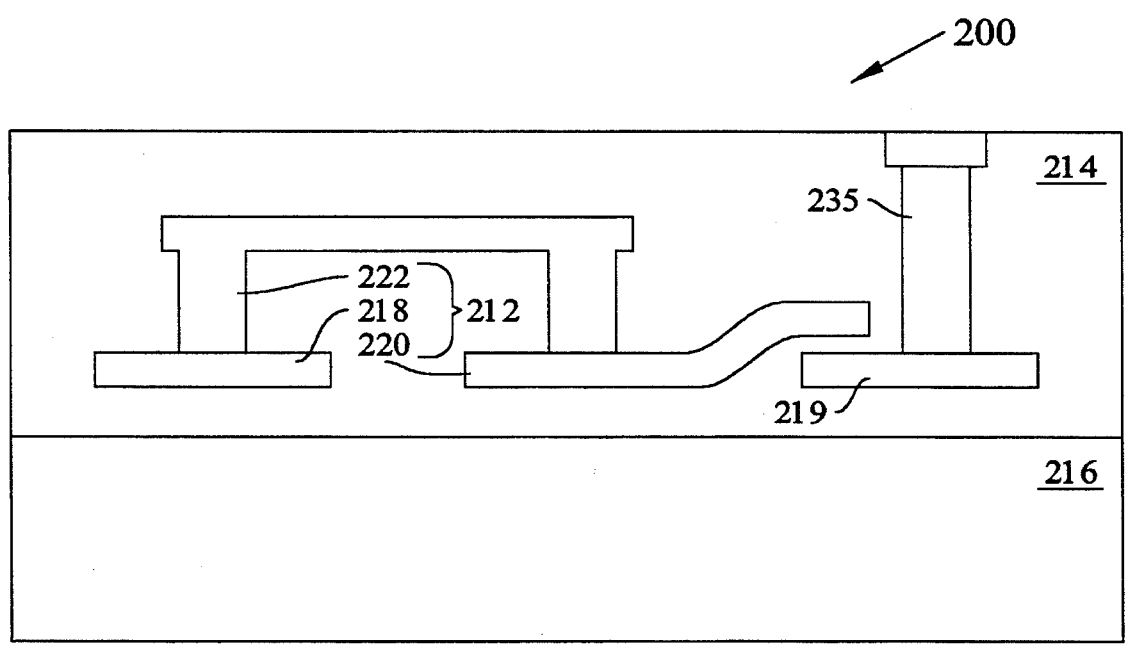
FIG. 5 is a cross-sectional view of the integrated memory element of FIG. 4 taken along view 5—5.

Referring to FIGS. 4 and 5, there is shown a non-volatile, programmable memory element 200 which includes a floating gate structure 212 supported in electrical isolation in an electrically insulating dielectric structure 214 formed over a bulk silicon substrate 216.

Figure 6:
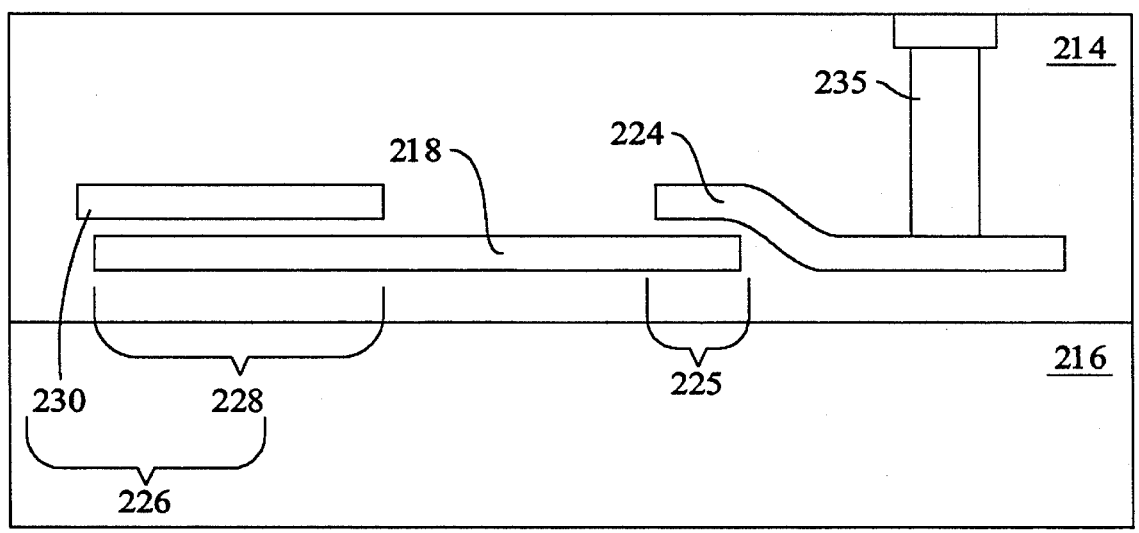
FIG. 6 is a cross-sectional view of the integrated memory element of FIG. 4 taken along view 6—6.

In the embodiment of the memory element 200 illustrated in FIG. 4, the floating gate structure 212 is fabricated from poly-1 and poly-2 (polysilicon) layers, as well as a layer composed of a conductor, such as a metal, which provides electrical interconnection between the poly-1 and poly-2 layers. The floating gate structure 212 comprises a first layer polysilicon structure 218 which forms a "floating gate," electrically connected to a separate second layer polysilicon structure 220 by an interconnect 222, preferably comprising metal. As shown in FIG. 6, one or more fingers 225 of polysilicon structure 218, supported in the dielectric structure 214, underlies and is separated from a third polysilicon structure 224 by the intervening dielectric structure 214. The distance between the polysilicon structures 224 and 218 (FIG. 6), and between the polysilicon structures 219 and 220 (FIG. 5) allow charge to be transferred through the intervening dielectric structure 214.

A bias capacitor 226 comprises a region 228 of the first layer polysilicon structure 218 and the region of a second-layer polysilicon structure 230, supported by a dielectric structure 214, which overlies and is separated from the first-layer polysilicon structure 218 by the intervening dielectric structure 214. The bias capacitor 226 may be employed to bias the floating gate structure 212.

A bias terminal 234 comprises an electrically conducting layer that extends through the dielectric structure 214 to provide an electrical connection to polysilicon structure 230. An interconnect 222 also extends through the dielectric structure 214 to provide electrical contact between the polysilicon structures 218 and 224. An interconnect 235 extends through the oxide structure 214 to provide an electrical connection to polysilicon structures 224 and 219, thereby providing a programming terminal.

The charge on the floating gate structure 212 may be either incremented or decremented depending on the polarity of the voltage applied across the programming terminal 235 and the bias terminal 234. Charge on the floating gate structure 212 is incremented by applying a positive voltage having a predetermined magnitude to the programming terminal 235 relative to the bias terminal 234. Charge on the floating gate structure 212 is decremented by applying a negative voltage having a predetermined magnitude to the programming terminal 235 relative to the bias terminal 234, shown in FIG. 2.

It is believed that the physical process by which charge may be incremented or decremented to and from the floating gate structure 212 results from electron tunneling through the oxide structure 214 due to oxide thinning and electric field enhancement where the polysilicon structure 224 oversteps the corners and edges of the polysilicon structure 218, and where the polysilicon structure 220 oversteps the corner of polysilicon structure 219.

A portion of the floating gate 212 may be formed as a gate to control, by way of example, a channel region 238 of an MOS transistor 240. In other applications, the floating gate structure 212 may be shared with a pair of complementary read devices such as the analog multiplier described in U.S. Pat. No. 4,906,873, incorporated herein by reference.

Figure 7:
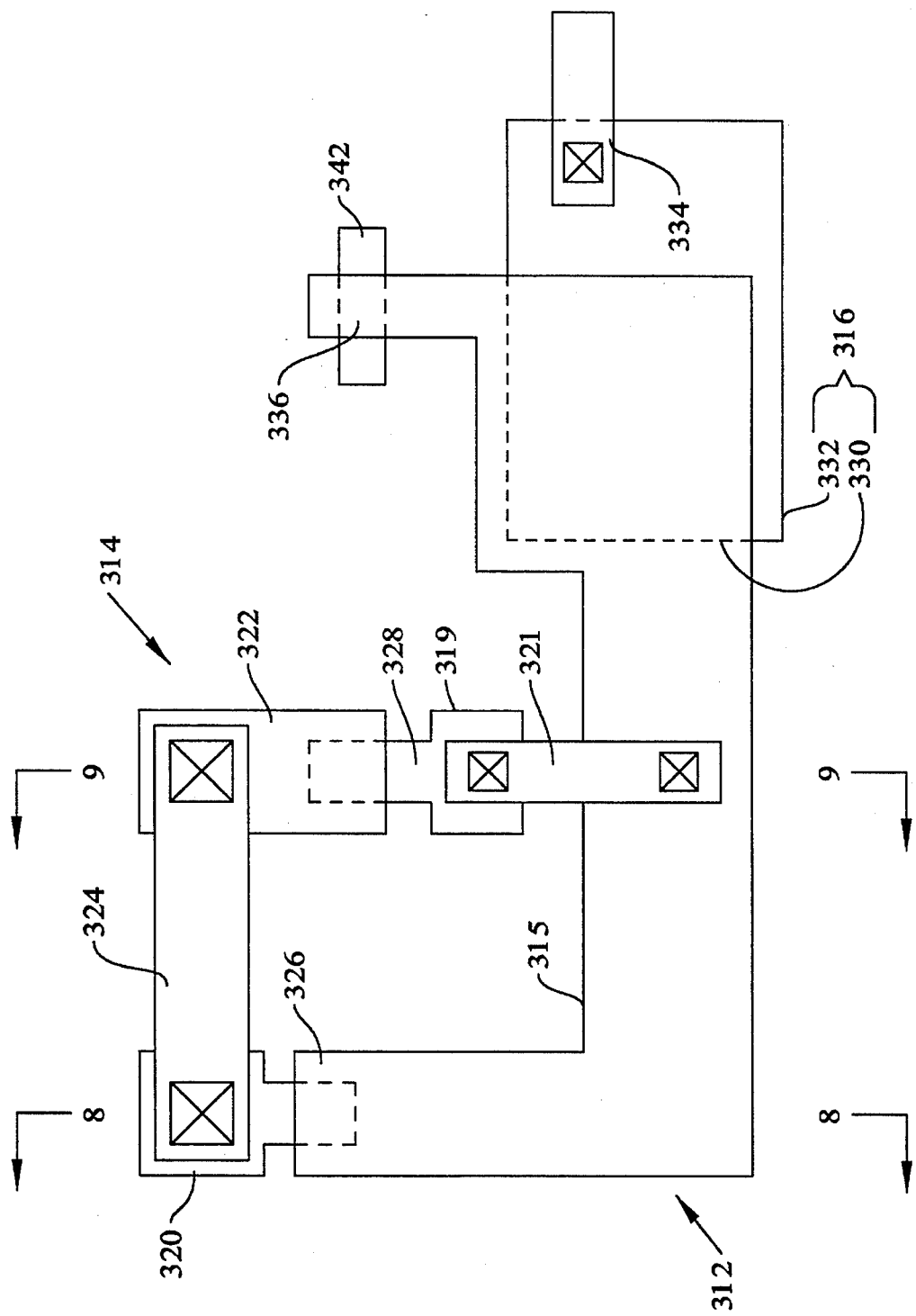
FIG. 7 shows a plan view of yet another embodiment of a non-volatile bidirectional integrated memory element embodying various features of the present invention.
Figure 8:
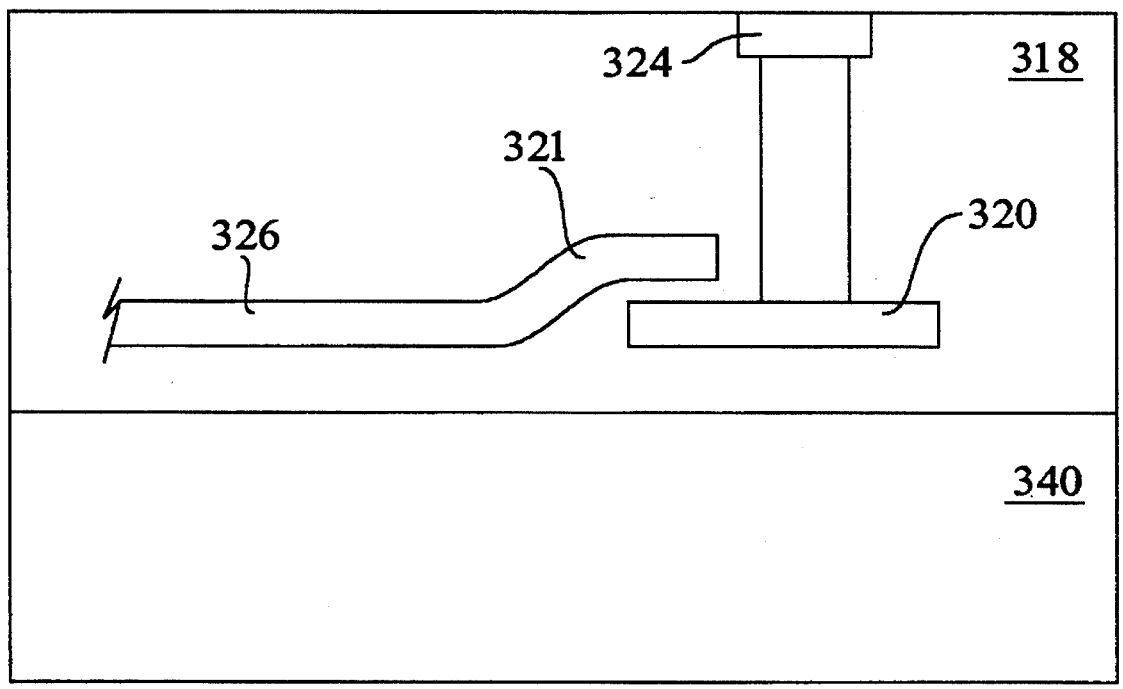
FIG. 8 is a cross-sectional view of the integrated memory element of FIG. 7 taken along view 8—8.

Referring to FIGS. 7 and 8, there is shown a non-volatile bidirectional integrated memory element 300 which includes a floating gate structure 312, a programming terminal structure 314, and a capacitor structure 316, all supported by a dielectric structure 318 formed over a bulk substrate 340 such as silicon. The dielectric structure may be comprised of one or more layers of an oxide or nitride.

The floating gate structure 312 includes a second-layer polysilicon structure 315 which is electrically connected to a first-layer polysilicon structure 319 by an interconnect 321, which may comprise a metal. The entire floating gate structure 312 is supported and completely surrounded by dielectric structure 318. A portion of the polysilicon structure 315 may be formed as a gate to control the channel region 336 of an MOS transistor 342.

Figure 9:
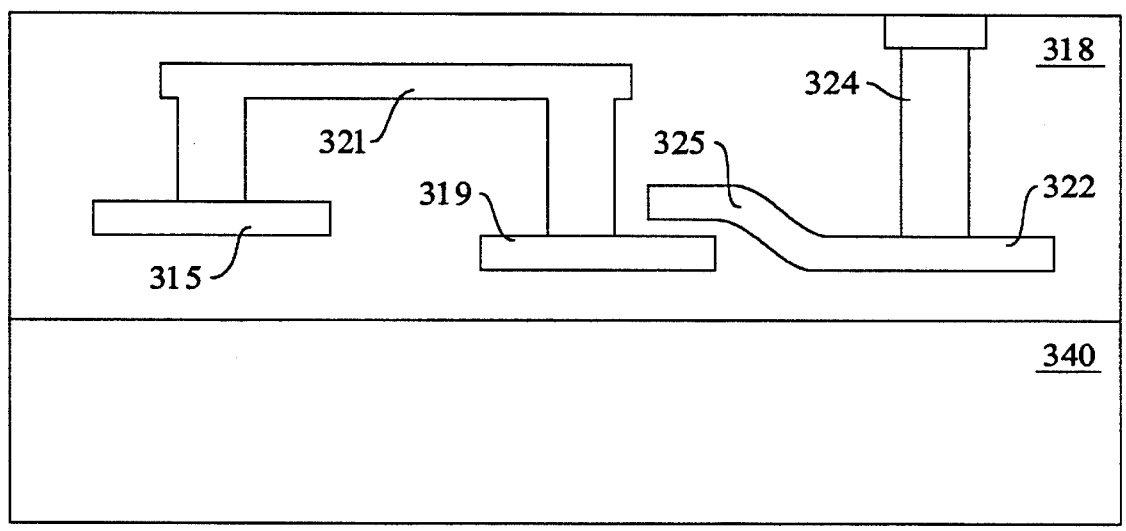
FIG. 9 is a cross-sectional view of the integrated memory element of FIG. 7 taken along view 9—9.

The programming terminal structure 314 includes first-layer polysilicon structures 320 and second layer polysilicon structure 322 which are electrically connected by an electrically conductive interconnect 324. Referring to FIG. 8, the polysilicon structure 326 includes an S-shaped cross-section region 321 overlying a section of the polysilicon structure 320 and separated from the polysilicon structure 320 by the intervening dielectric structure 318. As shown in FIG. 9, the polysilicon structure 322 includes an S-shaped cross-section region 325 overlying a section of polysilicon structure 319 and separated from the polysilicon structure 319 by the intervening dielectric structure 318.

The bias capacitor structure 316 comprises a region 330 of the second-layer polysilicon structure 315 and an underlying region of first-layer polysilicon structure 332 separated from the polysilicon layer 315 by the intervening dielectric structure 318. A bias terminal 334 connected to the polysilicon structure 332 allows an electrical field to be established between floating gate structure 312 and programming terminal 314. The charge on the floating gate structure 312 may be either incremented or decremented depending on the polarity of the voltage applied across the programming terminal structure 314 and the bias terminal 334.

The charging characteristics of the floating gate structures described with reference to FIGS. 1–9 are symmetric, meaning that the charge increment onto an initially uncharged floating gate structure that results from the application of a positive programming voltage of given magnitude and duration will be equal in magnitude to the charge decrement onto an initially uncharged floating gate structure that results from the application of a negative programming voltage of the same magnitude and duration.

Thus, it may be appreciated that the present invention provides a non-volatile bipolar integrated memory element that may be fabricated using standard double layer polysilicon MOS processes. The invention provides the advantage of allowing bipolar, symmetric changes in charge stored on the floating gate structure.

Obviously, many modifications and variations of the present invention are possible in light of the above teachings. Therefore, it is to be understood that within the scope of the appended claims, the invention may be practiced otherwise than as specifically described.

I claim:

1. A non-volatile, bidirectional integrated memory element, comprising:

a substrate;

a dielectric structure supported by said substrate;

a programming terminal supported by said dielectric structure which includes:
   a first polysilicon structure;
   a second polysilicon structure; and
   an electrically conductive first interconnect which electrically connects said first polysilicon structure to said second polysilicon structure;

a floating gate structure supported by said dielectric structure which includes:
   a third polysilicon structure which partially overlies and is separated from a section of said first polysilicon structure by said dielectric structure;
   a fourth polysilicon structure which is overlain and separated from a section of said second polysilicon structure by said dielectric structure; and
   an electrically conductive second interconnect which electrically connects said third polysilicon structure to said fourth polysilicon structure;

a bias capacitor having a first plate formed by a portion of said floating gate structure and a second plate; and a bias terminal electrically connected to said second plate of said bias capacitor.

2. The non-volatile, bidirectional integrated memory element of claim 1 wherein said dielectric structure comprises an oxide or a nitride.

3. The non-volatile, bidirectional integrated memory element of claim 1 wherein said substrate comprises silicon.

4. The non-volatile, bidirectional integrated memory element of claim 1 wherein electrical charge on said floating gate structure is incremented by applying a predetermined positive voltage across said programming and bias terminals, and is decremented by applying a predetermined negative voltage across said programming and bias terminals.

5. The non-volatile, bidirectional integrated memory element of claim 4 wherein said dielectric structure comprises an oxide or a nitride.

6. The non-volatile, bidirectional integrated memory element of claim 4 wherein said substrate comprises silicon.

7. A non-volatile, bidirectional and electrically programmable integrated memory element, comprising:

a substrate;

a dielectric structure supported by said substrate;

a floating gate structure including:
   first polysilicon structure supported in said dielectric structure;
   a second polysilicon structure supported in said dielectric structure; and
   a first interconnect electrically connecting said first and second polysilicon structures;

a capacitor including:
- a first plate formed by a first region of said first polysilicon structure;
- a second plate formed by a region of a third polysilicon structure which overlies and is separated from said first region of said first polysilicon structure by said dielectric structure;

a bias terminal comprising a section of said third polysilicon structure;

a programming terminal which includes:
- a fourth polysilicon structure supported by said dielectric structure which partially underlies and is separated from a region of said second polysilicon structure by said dielectric structure;
- a fifth polysilicon structure supported by said dielectric structure and which partially overlies and is separated from a second region of said first polysilicon structure by said dielectric structure; and
- a second interconnect electrically connecting said fourth and fifth polysilicon structures.

8. The non-volatile, bidirectional and electrically programmable integrated memory element of claim 7 wherein said dielectric structure comprises an oxide or a nitride.

9. The non-volatile, bidirectionally and electrically programmable integrated memory element of claim 7 wherein said substrate comprises silicon.

10. The non-volatile, bidirectional and electrically programmable integrated memory element of claim 7 wherein electrical charge is transferred between said programming terminal and said floating gate structure when a predetermined voltage is applied across said programming and bias terminals.

11. A non-volatile, bidirectional and electrically programmable integrated memory element, comprising:

a substrate;

a dielectric structure supported by said substrate;

a floating gate structure including: first polysilicon structure supported in said dielectric structure;

a second polysilicon structure supported in said dielectric structure; and a first interconnect electrically connecting said first and second polysilicon structures;

a capacitor including:
- a first plate formed by a first region of said second polysilicon structure;
- a second plate formed by a region of a third polysilicon structure which underlies and is separated from said first region of said second polysilicon structure by said dielectric structure;

a bias terminal electrically connected to said third polysilicon structure;

a programming terminal which includes:
- a fourth polysilicon structure supported by said dielectric structure which partially underlies and is separated from a second region of said second polysilicon structure by said dielectric structure;
- a fifth polysilicon structure supported by said dielectric structure and which partially overlies and is separated from a region of said first polysilicon structure by said dielectric structure; and
- a second interconnect electrically connecting said fourth and fifth polysilicon structures.

12. The non-volatile, bidirectional and electrically programmable integrated memory element of claim 11 wherein said dielectric structure comprises an oxide or a nitride.

13. The non-volatile, bidirectionally and electrically programmable integrated memory element of claim 11 wherein said substrate comprises silicon.

14. The non-volatile, bidirectional and electrically programmable integrated memory element of claim 11 wherein electrical charge is transferred between said programming terminal and said floating gate structure when a predetermined voltage is applied across said programming and bias terminals.

* * * * *